United States Patent [19]
Knoth et al.

[11] Patent Number: 5,600,317
[45] Date of Patent: Feb. 4, 1997

[54] APPARATUS FOR THE CONVERSION OF ANALOG AUDIO SIGNALS TO A DIGITAL DATA STREAM

[75] Inventors: Mattias Knoth, Gründau; Thomas Reussner, Darmstadt; Helmut Jahne, Berlin; Olaf Altenburg, Berlin; Klaus Cain, Berlin; Detlef Kutschabsky, Berlin, all of Germany

[73] Assignee: Stage Tec Entwicklungsgesellschaft für professionelle Audiotechnik mbH, Germany

[21] Appl. No.: 490,136

[22] Filed: Jun. 14, 1995

[30] Foreign Application Priority Data

Jun. 14, 1994 [DE] Germany .......................... 44 20 713.1
Jan. 12, 1995 [DE] Germany .......................... 195 02 047.2

[51] Int. Cl.$^6$ .............................. H03M 1/10; H03M 1/06
[52] U.S. Cl. .......................... 341/139; 341/118; 341/120
[58] Field of Search .................................. 341/118, 120, 341/139, 131, 141

[56] References Cited

U.S. PATENT DOCUMENTS

| | | | |
|---|---|---|---|
| 3,790,947 | 2/1974 | Campbell et al. | 341/131 |
| 4,129,864 | 12/1978 | Carpenter et al. | |
| 4,943,807 | 7/1990 | Early et al. | 341/120 |
| 4,999,628 | 3/1991 | Kakubo et al. | |
| 5,093,660 | 3/1992 | Beauducel | 341/139 |
| 5,146,223 | 9/1992 | Muto | 341/118 |
| 5,250,948 | 10/1993 | Berstein | |

FOREIGN PATENT DOCUMENTS

| | | |
|---|---|---|
| 0346605 | 12/1989 | European Pat. Off. |
| 0567145 | 10/1993 | European Pat. Off. |
| 3611922 | 10/1987 | Germany . |
| 87/06080 | 10/1987 | WIPO . |

Primary Examiner—Howard L. Williams
Assistant Examiner—Peguy JeanPierre
Attorney, Agent, or Firm—Dvorak and Traub

[57] ABSTRACT

This invention relates to a circuit for converting an analog audio signal into a highly resolving bit stream. An audio signal ($U_{In}$) is converted on several parallel paths (1, 2) having different amplitude sensitivities into a data stream, where the offset of the individual paths (1, 2) is compensated for individually. Subsequently the amplification difference produced by the different amplitude sensitivities is determined and compensated for, so that one of the two data streams is made available as a bit stream for further processing. The selection of the data stream which is made available as a bit stream for further processing, is determined based on the amplitude of the audio signal ($U_{In}$). Each of two parallel paths (1, 2) has three steps (21, 28, 66; 11, 12, 13), which are connected in series, and the conversion of the audio signal in the bit stream by an analog/digital converter (26, 14) takes place in the two first steps (21, 11), and an A/D converter (26) is connected in series with one of the two steps of an amplifier (22), and the error compensation is carried out in the second and third steps (28, 55; 12, 13) of the two parallel paths.

13 Claims, 1 Drawing Sheet

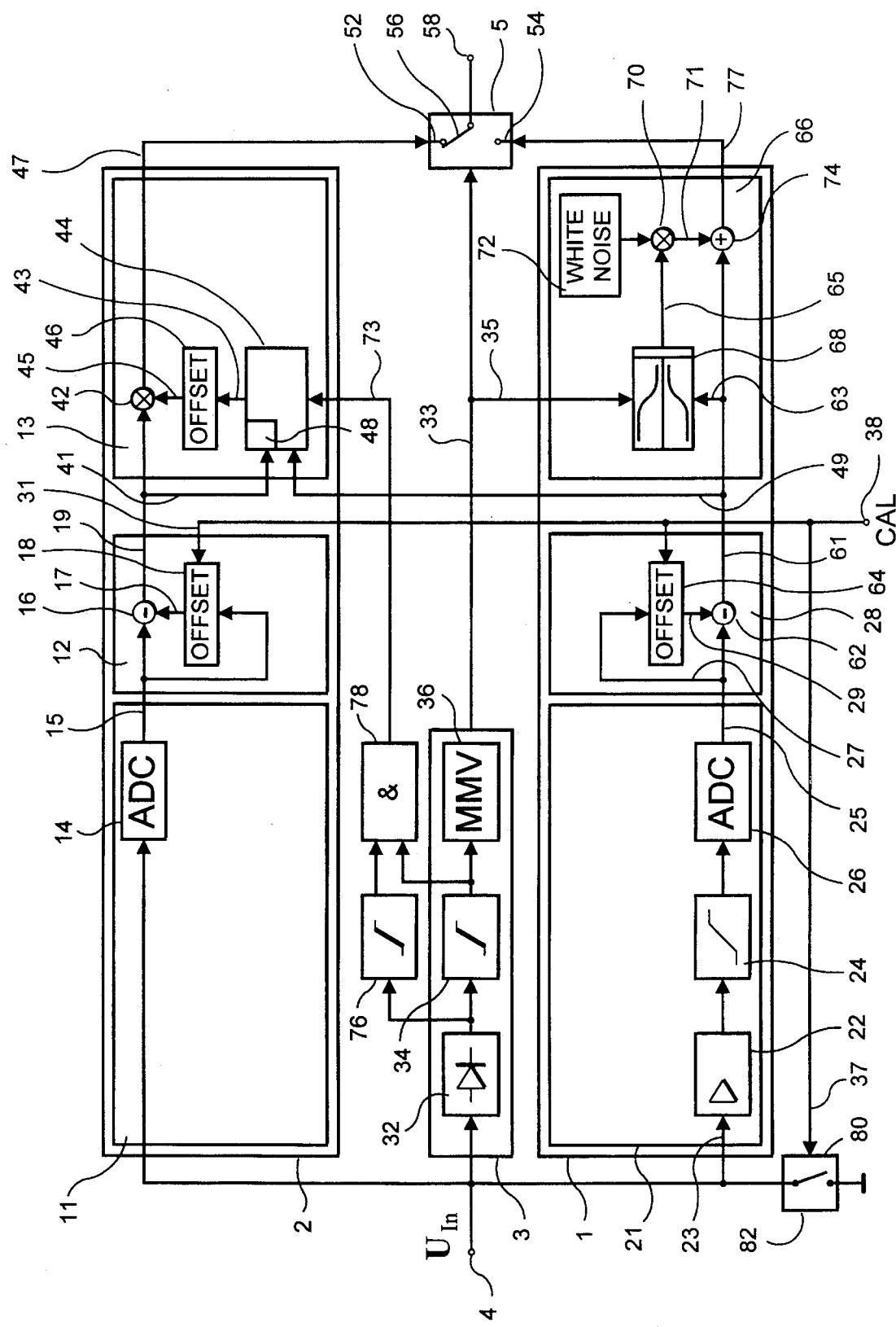

5,600,317

APPARATUS FOR THE CONVERSION OF ANALOG AUDIO SIGNALS TO A DIGITAL DATA STREAM

BACKGROUND OF THE INVENTION

Field of the Invention

The invention relates to an apparatus for the conversion of analog audio signals to a digital data stream.

In order to widen the dynamic range of analog/digital converters (A/D converters) that are available in audio technology, a converter is used by means of the so-called "gain-ranging" technique in each of two parallel signal paths, the one serving for high levels and the other for low levels of the audio signal that is to be converted. The audio signal to be converted is amplified analogically in one path before conversion, and amplified in the other path by the same amount, but digitally after the A/D conversion. Both paths terminate in a double-throw switch which prepares for further processing the digital data stream from whichever path is optimally modulated by the audio signal that is to be converted.

Apparatus of this technology generally have the disadvantage that the switching from one path to the other for the processing of the digital data stream can make undesired clicks, distortion and noise modulation audible. Above all, circuit noise, DC offsets and gain errors in the circuits largely nullify the advantage of the dynamic gain. Attempts are made to minimize these disturbances by suppressing their subjective audibility.

A soft smoothing over in the switching from one path to the other has the considerable disadvantage that the data streams have to be delayed by the amount of the smoothing time, which in most cases is not acceptable.

The use of high-pass filters can reduce clicking, but it is a very complicated measure, inasmuch as it has to be implemented in both paths. The final accuracy of the digital high-pass filters used also leads to additional distortion.

To time the switching from one path to the other the digital information at the output of the converters has been used. Consequently the HF damping of the anti-aliasing filters leads to a falsification of the actual level at the entrance to the path, and in the case of high-level and high-frequency signals it can bring the result of switching erroneously to the output of the converter for low-level signals, although the latter is already over-modulated. The resultant distortions are completely unacceptable.

SUMMARY OF THE INVENTION

The invention therefore is addressed to the problem of improving the high-resolution conversion of analog audio signals to a digital data stream at low cost, and especially of reducing those disturbances which occur upon switching from one signal path to another signal path, for the preparation of a digital data stream very accurately corresponding to the audio signal received.

To solve this problem a circuit is provided in accordance with the invention for the conversion of an analog audio signal to a bit stream of high resolution in which the audio signal is converted on a plurality of parallel paths of different amplitude sensitivity, and then the errors due to conversion are compensated. Due to the compensation of errors between conversion and switching, in the latter the errors caused in conversion can no longer occur, so that the disturbances are eliminated. To further minimize disturbances it is recommendable to operate the switching of the prepared data stream from either of the two paths in accordance with the amplitude of the audio signal to be converted. Additional preferred embodiments of the invention are given in the subordinate claims.

BRIEF DESCRIPTION OF THE DRAWINGS

FIG. 1 is a circuit diagram of an embodiment of the invention.

The invention will be described in detail hereinbelow with the aid of the circuit diagram represented by way of example in the appended drawing.

DETAILED DESCRIPTION OF THE INVENTION

In the embodiment of the invention represented in FIG. 1, the apparatus consists of two signal paths 1 and 2, as well as a control path 3, which are connected in parallel between an input terminal 4 marked Urn and a double-throw switch 5.

The first signal path 1 has three stages in tandem, the first stage 21 of which contains, connected in series, an amplifier 22 with the amplification factor V, a voltage limiter 24 and an A/D converter 26. The input line 23 of the amplifier 22 is connected to the signal input 4. The output line 25 from the A/D converter 26 is simultaneously the input signal line for the second stage 28. It contains a subtractor 62 that is connected to the signal input line 25 and its other input line 29 comes from an offset register 64. Through a branch line 27 of the signal line 25 the offset register 64 can be charged with the signal present on signal line 25 when a control signal CAL is present on line 31.

The output line 61 of the subtractor 62 is both the signal output line of the second stage 28 and the signal input line for the third stage 66 of the first signal path 1. A branch 49 of the signal line 61 leads to an x-input of a gain error detector 44 from the third stage 13 of the second signal path 2. Another branch line 63 of the signal line 61 leads to an input of the envelope emcee generator 68 whose output line 65 leads into a multiplier 70. The multiplier 70 receives another input from a noise generator 72. The output of the multiplier 70 leads through line 71 to an input of an adder 74 which receives its other input from the signal line 61. The output line 77 of the adder leads to a switch contact 54 of the double-throw switch 5.

The second signal path 2 likewise has three stages 11, 12 and 13 in series, the first stage 11 of which has an A/D converter connected at the input end to the terminal 4. At the output end the A/D converter 14 is connected to the input of the second stage 12 through line 15. The input line 15 of the second stage 12 leads on the one hand to the input of a subtractor 16 and through a branch line to the charging input of an offset register 18 which, when a CAL control signal is present on control signal line 31 at the control input of the offset register 18, is charged by the signals arriving on line 15.

The output line 61 of the subtractor 62 is both the signal output line of the second stage 28 and the signal input line for the third stage 66 of the first signal path 1. A branch 49 of the signal line 61 leads to an x-input of a gain-error detector 44 from the third stage 13 of the second signal path 2. Another branch 63 of the signal line 61 leads to an input of an envelope curve generator 68 whose output line 65 leads into a multiplier 70. The multiplier 70 receives an additional input from a noise generator 72. The output of the multiplier 70 leads through line 71 to an input of an adder 74 which receives its other input from the signal line 61. The output line 77 of the adder runs to a switch contact 54 of the double-throw switch 5.

The second signal path 2 likewise has three stages 11, 12 and 13 in series, the first stage 11 of which has an A/D converter 14 connected to the terminal 4 at the input end. At the output end the A/D converter 14 is connected to the input of the second stage 12 through line 15. Line 15 of the second stage 12 leads on the one hand to the input of a subtractor 16 and via a branch line to the charging input of an offset register 18 which, when a CAL control signal is present on control signal line 31 at the control input of the offset register 18, is charged with the signals arriving on line 15. The content of the offset register 18 passes through line 17 into the subtractor 16. The output line 19 from the subtractor 16 is at the same time the output line of the second stage 12 and the input line for the third stage 13.

The third stage 13 has a multiplier 42 which receives the signals arriving on signal line 19. A branch 41 of the signal line 19 goes to a y-input of the gain-error detector 44 which can charge a coefficient register 46 through an output line 43. The digital value contained in the coefficient register 46 can be fed through output line 45 as an additional input to the multiplier 42. The output line 47 of the multiplier 42 leads to an additional contact 52 of the double-throw switch 5.

Control path 3 contains a series circuit composed of a full-wave rectifier 32 whose input is connected to the signal input 4, a Schmitt trigger 34 and a re-triggerable monostable multivibrator 36 whose control signal output line 33 runs on the one hand to a control input of the double-throw switch 5 and on the other hand via branch line 35 to an additional input of the envelope curve generator 68. A control signal on line 33 causes the arm 56 of double-throw switch 5 to change from contact 52 to contact 54 or vice-versa. The selected digital data stream is made available by arm 56 through terminal 58 for further processing.

At chosen points in time the externally formed calibration signal is present at terminal 38 as the CAL control signal which is fed via signal line 31, as mentioned, to the offset registers 18 and 64 and also via control signal line 37 to the control connection of a relay 80. The relay 80 can short-circuit the signal input terminal 4 to ground in accordance with the presence of a control signal on line 37.

It is to be understood that the double-throw switch 5 is an electronic switch which here is represented and described as a double-throw switch only for simplification.

The A/D converters 14 and 26 and the circuits of the second and third stages 12 an 13, and 28 and 66 are cycled by a cycling source not shown, which provides a sampling cycle. The corresponding sampling signal lines have been omitted from the drawing for the sake of clarity.

As explained above, the two stages 12 and 28 are of equal construction and they serve to compensate for erroneous direct-current shifts occurring in the corresponding first stages 11 and 21. The calibration signal CAL at terminal 38 serves for this purpose. The calibration can be performed at any desired time. It is recommendable to perform the calibration prior to the audio signal conversion, as well as at later points of time if necessary. Since the DC shift as a rule changes but slowly, it is sufficient to produce the calibration only at relatively long time intervals.

As long as the voltage $U_{In}$ at the input contact 4 of the audio signal that is to be converted is null (say due to shorting by relay 80), data words representing the offset errors will be fed to the subtractors 16 and 62 upon each sampling pulse from the preceding converters and other circuits. As long as the calibration signal CAL is not on the lines 31 and 37, the inputs to the offset registers 18 and 64 are blocked and the contact 82 of relay 80 is open. If, however, the calibration signal CAL is present on lines 31 and 37 through contact 38, the relay 80 will first close contact 82 and $U_{In}$ will be made zero by the shorting of contact 4 to ground. The CAL signal furthermore opens tile inputs to the offset registers 18 and 64 so that upon the next sampling pulse they pick up the data word representing the offset error and cause this data word to be subtracted from the input signal from converters 14 and 26 in the subtractors 16 and 62, respectively. Therefore data words with a zero content will be present on the output lines 19 and 61. After the CAL signal ends the offset registers 18 and 64 contain the value newly loaded during the calibration, so that the amount of correction contained in the offset registers is constantly subtracted from the data streams delivered from the A/D converters 14 and 26. Thus the offset error in both data streams is compensated out of stages 1 and 2.

If the voltage $U_{In}$ of the analog audio signal that is to be converted is present at contact 4, it is fed parallel to the three stages 1, 2 and 3.

At the same time the signal path 1 serves for the A/D conversion of low-level audio signals $U_{In}$, while signal path 2 is used for the A/D conversion of the high-level audio signals $U_{In}$. In the control signal path 3 it is determined whether the level of the input voltage $U_{In}$ has exceeded a threshold determined by the setting of the Schmitt trigger 34. If the level of $U_{In}$ remains below the threshold value, the monostable multivibrator 36 is not triggered, so that the digital data stream present at the output contact 58 is taken out of the signal path 1. The threshold value is determined by the dimensions of the Schmitt trigger which operates when the amplitude of $U_{In}$ rises, just before the end of the contents of the A/D converter. If the amplitude of $U_{In}$ exceeds the threshold, the action of the Schmitt trigger 34 produces a triggering of the next-following monostable multivibrator 36, which in turn produces on the control signal line a signal which causes the switch 5 to change the arm over to contact 52, so that the digital data stream that has been prepared at contact 58 is taken out of the signal path 2.

Since the A/D converter 14 (in contrast to A/D converter 26) obtains the signal unamplified, its stock of values still permits coding of the audio input signal at levels that are already above the modulation limit of the A/D converter 26 and thus above the threshold. After the correction of the offset error in stage 12 as explained, the data stream leaving the A/D converter 14 is amplified in the next-following multiplier 42 by the coefficients contained in the coefficient register 46, at first by an amplification V that is equal to the amplification V of the amplifier 22.

Although both amplifications are theoretically equal to V, the two degrees of amplification are practically unequal on account of the inherent differences in the parameters and tolerances in the participating electronic circuits, to the degree that the difference is audible upon the switching.

For that purpose an averaging is performed in the gain-error detector 44 according to the formula:

$$\frac{1}{n} \sum_{i=1}^{n} x_i/y_i$$

wherein $x_i/y_i$ is a data word from the signal path 1, $y_i$ is a data word from signal path 2 amplified by the factor V, and I . . . n is the number of sampling pulses. With this averaging running in each case through n sampling pulses the actual difference dV of the degrees of amplification of the digital data streams on the output lines 47 and 77 is reduced to such an extent that the residual errors on the data streams furnished by contact 58 are no longer perceptible upon switchover.

In the input stage 48 of the gain error detector 44, the values from line 41 are amplified by the factor V before the averaging is done, and the above-mentioned average that has been determined is also multiplied by the amplification factor V, so as to assure the said amplification of the data stream leaving stage 12 in the multiplier 42.

The gain error detector 44 performs the said averaging increased by the factor V only for input signals $U_{In}$ of average level which deliver the applicable data words out of the particular value range of values, both on line 15 from the A/D converter 14, and on line 25 from the A/D converter 26. The range of levels of the analog audio signal $U_{In}$ that is suitable for this purpose, also is determined from the relationship $sw/2 < U_{In} < sw$, sw being the above-mentioned threshold value. Only if this condition is satisfied should the coefficient register 14 be actualized.

For this purpose an additional Schmitt trigger 76 is connected to the output of the full-wave rectifier 32 and delivers an output signal to a gate 78 when the level of the audio signal $U_{In}$ reaches the value sw/2 and exceeds it. The other input of the gate 78 is the inverted output signal from the Schmitt trigger 34. The output signal from the AND gate 78 is fed to the gain error detector 44 via line 74 as the activating signal.

The activation can also be performed by comparing the values x and y within the gain error detector 44.

Therefore the gain error between the two signal paths 1 and 2, which due to the non-ideal properties of the components of amplifier 22, voltage limiter 24 (which serves to prevent overmodulation of the A/D converter 26), A/D converter 26 and A/D converter 14, is compensated. According to the invention the dynamic range of the apparatus is thus expanded by the amount of the chosen amplification factor V.

In the envelope curve generator 68 there are stored two different value ranges, a first one of which is retrieved from the data words entered onto line 63, and the second range is retrieved after a signal is present on line 35. The first range of values increases slowly at first as the content of data words arriving on line 63 increases, and then faster, until toward the end of the value range of the data words on line 63 it approaches a limit indicated by the curve shown in the figure. The noise signal emitted by the noise generator 72 is multiplied in multiplier 70 by the individual values obtained from the data words on line 63, and the product is fed in adder 74 to the data stream via line 71. Therefore, in the case of an audio signal of low level, whose amplitude rises toward the threshold, more and more noise signal is added and thus compared with the noise signal content in the data stream fed through line 47 to the switch 5. The individual values of the first value range in the envelope curve generator 68, especially their upper limit, is obtained experimentally and set by detecting the noise content of the data stream arriving on line 47.

The second range of values stored in the envelope curve generator 68 increasingly diminishes slope-wise from the above-mentioned upper limit and is retrieved step by step in the sampling cycle through the flank of the control signal present on line 35, which triggers the change over of the switch arm 56 from contact 52 to contact 54. Before the values retrieved in this manner from the second value range are transmitted, a comparison is made of the values with those which are produced simultaneously by the data words on line 63 from the first range of values. The greater of two compared values is fed to the multiplier 70. This comparison assures that, in the event of an audio signal amplitude which, after dropping below the threshold value, rises again sooner than the values from the slope of the second value range have run out, in the next switch operation it will not be the then-small noise signal admixture corresponding to a low slope value that will be admixed with the data stream on line 77, but the noise amplitude triggered by the data word on line 63.

Furthermore, after the end of a trigger pulse from the Schmitt trigger 34 the monostable multivibrator switches back after a preset time period, during which the data stream is taken from the signal path 2 by the switch 5, even though the amplitude of the audio signal that is to be converted would justify its conversion in signal path 1.

Therefore it is possible in the manner described to bridge over the abrupt increase of the noise level when switching from one signal path to the other with switch 5, without the need for any delaying of the audio signal or data streams. The noise produced by stages 11, 12 and 13, which is more predominant due to amplification after conversion in the data stream on line 47, than that in the data stream on line 77, is therefore compensated by stage 66.

It is, of course, within the scope of the invention to provide, in addition to the two described signal paths 1 and 2, additional parallel signal paths with a more finely subdivided characteristic of response to the amplitudes of the audio signal received.

We claim:

1. A circuit for converting an analog audio signal into a highly resolving bit stream, for which the audio signal ($U_{In}$) is converted on several parallel paths (1,2) with different amplitude sensitivities into a data stream, wherein the offset of the individual paths (1,2) is compensated for individually and subsequently the amplification difference, produced by the different amplitude sensitivities, is determined and compensated for, so that one of the two data streams is made available as a bit stream for further processing, the selection of the data stream which is made available as a bit stream for further processing, is determined based on the amplitude of the audio signal ($U_{In}$).

2. The circuit of claim 1, wherein each of two parallel paths (1,2) has three stages (21, 28, 66; 11, 12, 13), which are connected in series, and the conversion of the audio signal in the bit stream by an analog/digital converter (26, 14) takes place in the two first stages (21, 11), and an A/D converter (26) is connected in series with one of the two stages of an amplifier (22), and the error compensation is carried out in the second and third stages (28, 55; 12, 13) of the two parallel paths.

3. The circuit of claim 2, wherein a direct current shift produced by the two first stages (21, 11), is compensated for in each of the two second stages (28, 12) of the two parallel paths (1,2) and the direct current compensation in the two second stages (28, 12) is actualized by a calibration signal (CAL).

4. The circuit of claim 3, wherein the calibration signal (CAL) short-circuits an input terminal (4) for the audio signals ($U_{In}$) and causes in each of the two second stages (28,12) an offset register (64,18) to take over a data word from the preceding first stages (21,11), the content of the corresponding offset register (64,18) being subtracted in a subtractor (62,16) from the data stream.

5. The circuit of claim 2, wherein the data stream is amplified by the amplification factor of the amplifier (22) in the third stage (13) of the parallel path (2), in the first stage (11) of which the audio signal is not amplified.

6. The circuit of claim 2, wherein an amplification error reduction is carried out in the third stage (13) of the parallel path (2), in the first stage (11) of which the audio signal is not amplified.

7. The circuit of claim 2, wherein in the third stage (66) of the parallel path (1) with preamplification, a noise-level adaptation is carried out in that a noise level addition is carried out in the third stage (66) with a level of the audio signal ($U_{In}$) increasing up to the threshold value to the magnitude of the noise portion of the data stream from the third stage of the second parallel path (2).

8. The circuit of claim 7, wherein the output signals of a noise generator (72), before admixture with the data stream, are multiplied in a multiplier (70) with values, which are retrieved from the data stream.

9. The circuit of claim 7, wherein in the third stage (66), a further range of values is stored, which has values decreasing in the manner of a ramp in the sampling cycle, and are retrieved by a control signal from the control signal path (3) and, after multiplication by the noise signals coming from the noise generator (72), are mixed into the data stream.

10. The circuit of claim 9, wherein the noise signals from the noise generator (72) are multiplied in the multiplier (70) by whichever value from the two value ranges is the greater.

11. The circuit of claim 1, wherein the two parallel paths (1,2) as well as a control signal path (3) are connected in parallel between an input terminal (4) for the audio signals ($U_{In}$) and a double-throw switch (5), a control signal for switching over the double-throw switch (5) being formed in the control signal path (3) from the level of the audio signal, and the level of the analog signal ($U_{In}$) is compared in the control signal path (3) with a threshold value (in 34) and control signals for the double-throw switch (5) are formed from the result of the comparison in such a manner that, when the level reaches the threshold value, the double-throw switch (5) is induced to select the data stream from that path (2), the first stage of which does not contain an amplifier, and, when the level falls below the threshold value, the double-throw switch (5), optionally after a specific period of time, is induced to select the data stream from the path, the first stage (21) of which contains the amplifier (22).

12. The circuit of claim 1, wherein an amplification error correction is performed in a range of levels, which lies approximately between half the threshold value and the threshold value.

13. The circuit of claim 12, wherein the amplification error correction is performed by averaging the data streams, which are taken from the respective second stages (28, 12) of the two parallel paths (1,2), the averaging being performed according to the formula $$\frac{1}{n} \sum_{i=1}^{n} x_i/y_i$$

wherein $x_i$ represents the data stream from the parallel path (1) with amplification before the conversion and $y_i$ represents the data stream, amplified by V, from the parallel path (2) without preamplification and n represents the number of sampling pulses.

* * * * *